(12) United States Patent  
Kim (10) Patent No.: US 10,622,423 B2  
(45) Date of Patent: Apr. 14, 2020

(54) ELECTROLUMINESCENT DISPLAY DEVICE (71) Applicant: LG DISPLAY CO., LTD., Seoul (KR)

(72) Inventor: Kanghyun Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/283,029

(22) Filed: Feb. 22, 2019

(65) Prior Publication Data

US 2019/0189714 A1 Jun. 20, 2019

Related U.S. Application Data (63) Continuation of application No. 15/681,778, filed on Aug. 21, 2017, now Pat. No. 10,243,029.

(30) Foreign Application Priority Data

Dec. 29, 2016 (KR) .................. 10-2016-0182359

(51) Int. Cl.  
*H01L 27/32* (2006.01)  
*H01L 51/00* (2006.01)

(52) U.S. Cl.  
CPC ........ *H01L 27/3246* (2013.01); *H01L 27/322* (2013.01); *H01L 27/3213* (2013.01); *H01L 51/0005* (2013.01); *H01L 2251/566* (2013.01)

(58) Field of Classification Search  
CPC .............. H01L 27/3246; H01L 27/322; H01L 27/3213; H01L 2251/566; H01L 27/3218; H01L 27/3211  
See application file for complete search history.

(56) References Cited

U.S. PATENT DOCUMENTS

2015/0115251 A1 4/2015 Jinta et al.  
2018/0166510 A1 6/2018 Lee

FOREIGN PATENT DOCUMENTS

JP 2001-143868 A 5/2001

*Primary Examiner* — Anthony Ho  
(74) *Attorney, Agent, or Firm* — Birch, Stewart, Kolasch & Birch, LLP

(57) ABSTRACT

A method for manufacturing an electroluminescent display device can include providing a plurality of pixels on a substrate; providing a plurality of sub pixels in each of the plurality of pixels; forming a first electrode at each of the sub pixels on the substrate; forming a bank layer covering an end of the first electrode on the substrate; coating a first emission layer corresponding to at least two sub pixels among the plurality of sub pixels; and coating a second emission layer corresponding to at least two other sub pixels among the plurality of sub pixels, in which the second emission layer is spaced apart from the first emission layer.

10 Claims, 8 Drawing Sheets

ELECTROLUMINESCENT DISPLAY DEVICE

CROSS REFERENCE TO RELATED APPLICATIONS

This Application is a Continuation of co-pending application Ser. No. 15/681,778, filed on Aug. 21, 2017, which claims the priority benefit of the Korean Patent Application No. 10-2016-0182359 filed in the Republic of Korea on Dec. 29, 2016, all of which are hereby incorporated by reference as if fully set forth herein.

BACKGROUND

Field of the Disclosure

Embodiments of the present invention relate to an electroluminescent display device, and more particularly, to an electroluminescent display device which is manufactured by a solution process.

Discussion of the Related Art

An electroluminescent display device is provided in such a way that an emission layer is formed between two electrodes. In this case, the emission layer emits light by an electric field formed between the two electrodes, to thereby display an image.

The emission layer may be formed of an organic material which emits light when exciton produced by a bond of electron and hole falls to a ground state from an excited state, or an inorganic material such as quantum dot.

Hereinafter, a related art electroluminescent display device will be described with reference to FIGS. 1A and 1B.

Figure 1A:
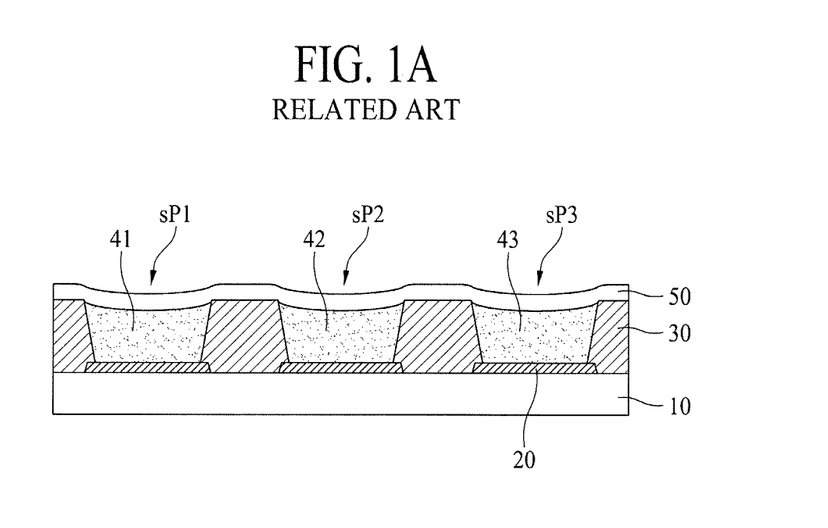
FIG. 1A is a cross sectional view illustrating a related art electroluminescent display device.
Figure 1B:
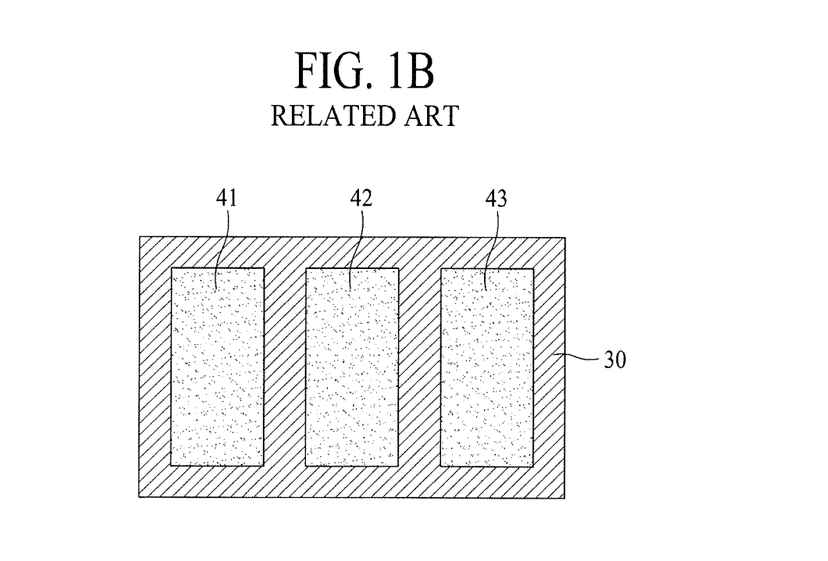
FIG. 1B is a plane view illustrating the related art electroluminescent display device.

FIG. 1A is a cross sectional view illustrating the related art electroluminescent display device, and FIG. 1B is a plane view illustrating the related art electroluminescent display device.

As shown in FIG. 1A, the related art electroluminescent display device may include a substrate 10, a first electrode 20, a bank layer 30, emission layers 41, 42 and 43, and a second electrode 50.

The first electrode 20 is provided on the substrate 10. The first electrode 20 is patterned by each sub pixel (sP1, sP2, sP3).

The bank layer 30, which covers an end of the first electrode 20, is provided on the substrate 10. The bank layer 30 defines an area of the sub pixel (sP1, sP2, sP3).

The emission layers 41, 42 and 43 are provided on the first electrode 20. The emission layer 41, 42 and 43 are individually provided in the sub pixels (sP1, sP2, sP3). That is, the first emission layer 41 is provided in the first sub pixel (sP1), the second emission layer 42 is provided in the second sub pixel (sP2), and the third emission layer 43 is provided in the third sub pixel (sP3). Accordingly, one pixel is defined by a combination of the first sub pixel (sP1), the second sub pixel (sP2) and the third sub pixel (sP3).

The emission layers 41, 42 and 43 may be individually patterned for each sub pixel (sP1, sP2, sP3) by a vacuum deposition process using a predetermined mask. However, if the emission layers 41, 42 and 43 are patterned by the vacuum deposition process, it is necessary to use a high-priced vacuum deposition apparatus, thereby causing the increase of manufacturing cost. Especially, if manufacturing a large-sized electroluminescent display device, it inevitably causes the increase of manufacturing cost due to the increased size of mask and vacuum deposition apparatus, thereby lowering productivity for mass production. Accordingly, in order to reduce the manufacturing cost, a solution process using an inkjet apparatus has been proposed so as to form the emission layers 41, 42 and 43.

As shown in FIG. 1B, the first emission layer 41, the second emission layer 42 and the third emission layer 43 are patterned, and the bank layer 30 is provided between the adjacent emission layers 41, 42 and 43. In this case, the first emission layer 41, the second emission layer 42 and the third emission layer 43 are aligned at fixed intervals.

However, in case of the related art electroluminescent display device, it has limitations on resolution.

In order to realize high resolution in the electroluminescent display device, it is necessary to decrease a size of the pixel. As shown in FIG. 1B, when the plurality of sub pixels (sP1, sP2, sP3) are aligned, a size of each sub pixel (sP1, sP2, sP3) has to be decreased so as to realize the high-resolution electroluminescent display device.

However, if the sub pixel (sP1, sP2, sP3) is decreased in size, an area of the emission layer 41, 42 and 43 in each of the sub pixels (sP1, sP2, sP3) is also decreased in size.

In order to realize high resolution in the electroluminescent display device according to the related art, it is necessary to decrease a size of each area in the emission layers 41, 42 and 43. To do this, it is necessary to reduce a size of a nozzle in the inkjet apparatus.

However, it has a limitation of size reduction in the nozzle of the inject apparatus. If forming the small-sized area of each emission layer 41, 42 and 43 by the use of inkjet apparatus, the emission layers 41, 42 and 43 may be mixed together.

Accordingly, it is difficult to make the size of the area in each emission layer 41, 42 and 43 be less than a predetermined value, whereby it is also difficult to realize the high resolution electroluminescent display device.

SUMMARY

Accordingly, embodiments of the present invention are directed to an electroluminescent display device that substantially obviates one or more problems due to limitations and disadvantages of the related art.

An aspect of embodiments of the present invention is directed to provide an electroluminescent display device capable of realizing high resolution, and preventing emission layers to be separated from each other from being mixed together for a solution process.

Additional advantages and features of embodiments of the invention will be set forth in part in the description which follows and in part will become apparent to those having ordinary skill in the art upon examination of the following or may be learned from practice of embodiments of the invention. The objectives and other advantages of embodiments of the invention may be realized and attained by the structure particularly pointed out in the written description and claims hereof as well as the appended drawings.

To achieve these and other advantages and in accordance with the purpose of embodiments of the invention, as embodied and broadly described herein, there is provided an electroluminescent display device that includes a first emission layer provided to correspond to at least two sub pixels among a plurality of sub pixels; a second emission layer provided to correspond to at least two sub pixels among the plurality of sub pixels, wherein the second emission layer is spaced apart from the first emission layer; and a bank layer provided along the boundary between the first emission layer and the second emission layer.

In another aspect of an embodiment of the present invention, there is provided an electroluminescent display device that includes a first emission layer and a second emission layer provided to correspond to at least two sub pixels among a plurality of sub pixels; a first bank layer provided along the boundary between each of the plurality of sub pixels; and a second bank layer provided along the boundary between the first emission layer and the second emission layer.

In another aspect of an embodiment of the present invention, there is provided an electroluminescent display device that includes a first area having a first emission layer provided to correspond to some sub pixels among a plurality of sub pixels; and a second area having a second emission layer provided to correspond to some sub pixels among the plurality of sub pixels, wherein the second area is separated from the first area, and wherein the number of sub pixels in the second emission layer is larger than the number of sub pixels in the first emission layer.

It is to be understood that both the foregoing general description and the following detailed description of embodiments of the present invention are exemplary and explanatory and are intended to provide further explanation of the invention as claimed.

BRIEF DESCRIPTION OF THE DRAWINGS

The accompanying drawings, which are included to provide a further understanding of embodiments of the invention and are incorporated in and constitute a part of this application, illustrate embodiment(s) of the invention and together with the description serve to explain the principle of embodiments of the invention. In the drawings.

DETAILED DESCRIPTION OF THE EMBODIMENTS

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error region although there is no explicit description.

In describing a position relationship, for example, when the positional order is described as 'on~', 'above~', 'below~', and 'next~', a case which is not contact may be included unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, an electroluminescent display device according to the embodiments of the present invention will be described with reference to the accompanying drawings. All the components of the electroluminescent display device according to all embodiments of the present invention are operatively coupled and configured.

Figure 2:
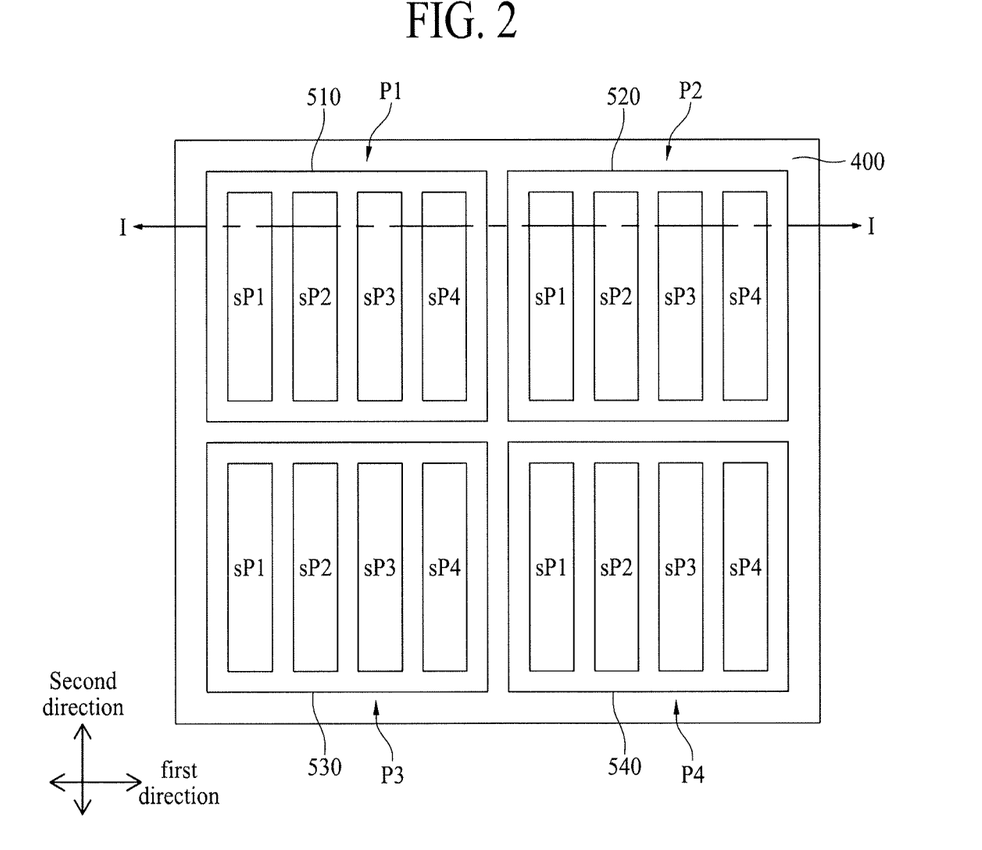
FIG. 2 is a plane view illustrating an electroluminescent display device according to one embodiment of the present invention.

FIG. 2 is a plane view illustrating an electroluminescent display device according to one embodiment of the present invention.

As shown in FIG. 2, the electroluminescent display device according to one embodiment of the present invention may include a first pixel (P1), a second pixel (P2), a third pixel (P3), and a fourth pixel (P4). The second pixel (P2) is adjacent to the first pixel (P1) in a first direction, for example, a horizontal direction. The third pixel (P3) is adjacent to the first pixel (P1) in a second direction, for example, a vertical direction which is different from the first direction. The fourth pixel (P4) is adjacent to the first pixel (P3) in the first direction.

Each of the first pixel (P1), the second pixel (P2), the third pixel (P3), and the fourth pixel (P4) may include a first sub pixel (sP1), a second sub pixel (sP2), a third sub pixel (sP3) and a fourth sub pixel (sP4).

The first sub pixel (sP1), the second sub pixel (sP2), the third sub pixel (sP3) and the fourth sub pixel (sP4) are arranged in the first direction, but are not limited to this structure. An arrangement of the sub pixels and the number of the sub pixels may be changed in various ways.

A first emission layer 510 is provided in the first pixel (P1), a second emission layer 520 is provided in the second pixel (P2), a third emission layer 530 is provided in the third pixel (P3), and a fourth emission layer 540 is provided in the fourth pixel (P4).

The first emission layer 510 is provided for the first sub pixel (sP1), the second sub pixel (sP2), the third sub pixel (sP3) and the fourth sub pixel (sP4) within the first pixel (P1) in common. The first emission layer 510 is provided in each of the first sub pixel (sP1), the second sub pixel (sP2), the third sub pixel (sP3) and the fourth sub pixel (sP4), and is also provided along the boundary between each of the sub pixels (sP1, sP2, sP3, sP4). Accordingly, the first emission layers 510 provided inside the respective first, second, third and fourth sub pixels (sP1, sP2, sP3, sP4) are connected with each other, and furthermore, formed as one body.

However, it is not limited to this structure. The first emission layer 510 may be provided to correspond to at least two sub pixels among the first sub pixel (sP1), the second sub pixel (sP2), the third sub pixel (sP3) and the fourth sub pixel (sP4). Herein, the emission layer corresponding to the pixels (P1, P2, P3, P4) or the sub pixels (sP1, sP2, sP3, sP4) indicates that the emission layer is formed as one body in the pixels (P1, P2, P3, P4) or the sub pixels (sP1, sP2, sP3, sP4).

The second emission layer 520 is provided for the first sub pixel (sP1), the second sub pixel (sP2), the third sub pixel (sP3) and the fourth sub pixel (sP4) within the second pixel (P2) in common. That is, the number of sub pixels (sP1, sP2, sP3, sP4) in the second emission layer 520 may be the same as the number of sub pixels (sP1, sP2, sP3, sP4) in the first emission layer 510. In this case, the first emission layer 510 and the second emission layer 520 may be formed for the same spraying process by the use of one inkjet nozzle.

The second emission layer 520 is provided in each of the first sub pixel (sP1), the second sub pixel (sP2), the third sub pixel (sP3) and the fourth sub pixel (sP4), and is also provided along the boundary between each of the sub pixels (sP1, sP2, sP3, sP4). Accordingly, the second emission layers 520 provided inside the respective first, second, third and fourth sub pixels (sP1, sP2, sP3, sP4) are connected with each other, and furthermore, formed as one body. However, it is not limited to this structure. The second emission layer 520 may be provided to correspond to at least two sub pixels among the first sub pixel (sP1), the second sub pixel (sP2), the third sub pixel (sP3) and the fourth sub pixel (sP4).

The third emission layer 530 and the fourth emission layer 540 are provided in the same manner as the first emission layer 510 and the second emission layer 520.

The first emission layer 510, the second emission layer 520, the third emission layer 530 and the fourth emission layer 540 are spaced apart from each other.

The second emission layer 520 is adjacent to the first emission layer 510 in the first direction. The first emission layer 510 and the second emission layer 520 emit a light of a same color such as a white color. The third emission layer 530 is adjacent to the first emission layer 510 in the second direction. The fourth emission layer 540 is adjacent to the third emission layer 530 in the first direction. The third emission layer 530 and the fourth emission layer 540 emit a light of a same color such as a white color. Also, the first emission layer 510, the second emission layer 520, the third emission layer 530, and the fourth emission layer 540 emit a light of a same color such as a white color.

In detail, the first emission layer 510, the second emission layer 520, the third emission layer 530 and the fourth emission layer 540 are spaced apart from each other by the bank layer 400 disposed therebetween.

The bank layer 400 is provided along the boundary between the first pixel (P1) and the second pixel (P2), the boundary between the first pixel (P1) and the third pixel (P3), the boundary between the third pixel (P3) and the fourth pixel (P4), and the boundary between the second pixel (P2) and the fourth pixel (P4), to thereby define an area for each of the first pixel (P1) the second pixel (P2), the third pixel (P3) and the fourth pixel (P4).

In detail, each of the plurality of sub pixels (sP1, sP2, sP3, sP4) includes a circuit element for making the first emission layer 510, second emission layer 520, the third emission layer 530, and the fourth emission layer 540 emit light. The circuit element may include a switching thin film transistor, a driving thin film transistor, a sensing thin film transistor and a capacitor, but is not limited to this structure.

According to one embodiment of the present invention, each of the first emission layer 510, the second emission layer 520, the third emission layer 530, and the fourth emission layer 540 is provided to correspond to at least two of the sub pixels (sP1, sP2, sP3, sP4). Thus, even though the plurality of sub pixels (sP1, sP2, sP3, sP4) are aligned in the first direction and each of the plurality of sub pixels (sP1, sP2, sP3, sP4) is decreased in size, a size of an area for each of the first emission layer 510, the second emission layer 520, the third emission layer 530, and the fourth emission layer 540 is not largely decreased so that it is possible to form the first emission layer 510, the second emission layer 520, the third emission layer 530, and the fourth emission layer 540 by the use of inkjet apparatus without mixing the first emission layer 510, the second emission layer 520, the third emission layer 530, and the fourth emission layer 540 together, to thereby realize a high-resolution electroluminescent display device.

Figure 3:
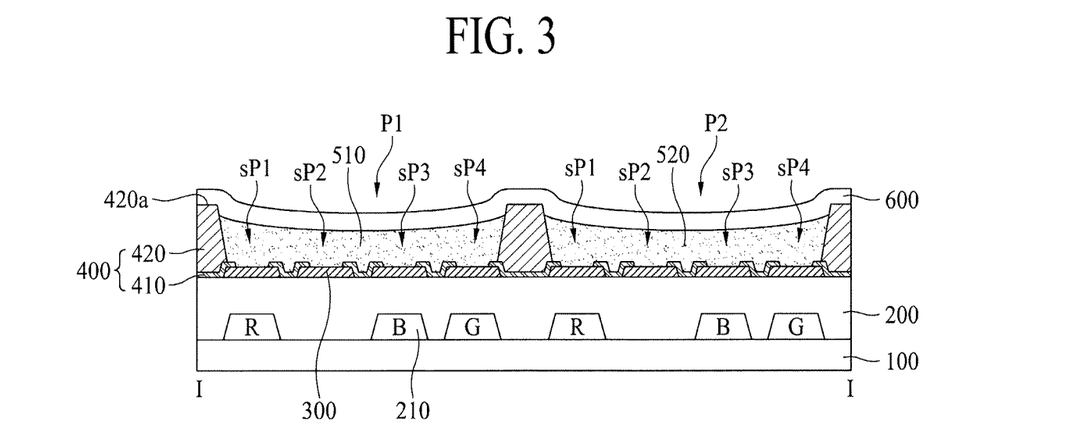
FIG. 3 is a cross sectional view illustrating the electroluminescent display device according to one embodiment of the present invention, which corresponds to a cross section along I-I line of FIG. 2.

FIG. 3 is a cross sectional view illustrating the electroluminescent display device according to the embodiment of the present invention, which corresponds to a cross section along I-I line of FIG. 2.

As shown in FIG. 3, the electroluminescent display device according to one embodiment of the present invention may include a substrate 100, a circuit device layer 200, a first electrode 300, a bank layer 400, emission layers 510 and 520, and a second electrode 600.

The substrate 100 may be formed of glass or transparent plastic, but is not limited to these materials.

The circuit device layer 200 is provided on the substrate 100. The circuit device layer 200 may include a thin film transistor and a capacitor provided for each sub pixel (sP1, sP2, sP3, sP4). The thin film transistor may include a switching thin film transistor, a driving thin film transistor, and a sensing thin film transistor. A structure of the circuit device layer 200 may be formed in various types generally known to those in the art.

A color filter 210 is provided in the circuit device layer 200. The color filter 210 may include a red color filter (R), a blue color filter (B), and a green color filter (G), but not necessarily. In the drawings, the red color filter (R) is provided in the first sub pixel (sP1), the color filter is not provided in the second sub pixel (sP2), the blue color filter (B) is provided in the third sub pixel (sP3), and the green color filter (G) is provided in the fourth sub pixel (sP4), wherein the second sub pixel (sP2) with no color filter emits white light, but is not limited to this structure. An arrangement of the red (R), blue (B) and green (G) color filters may be changed in various ways.

The color filter 210 is provided in a path of a light emission. As shown in the drawings, if the color filter 210 is disposed below the first emission layer 510 and the second emission layer 520, the light emitted from the first emission layer 510 and the second emission layer 520 advances toward the substrate 100, to thereby realize a bottom emission type electroluminescent display device. However, it is not limited to this structure. If the color filter 210 is provided above the second electrode 600, it is possible to realize a top emission type electroluminescent display device.

The first electrode 300 is provided on the circuit device layer 200. The first electrode 300 may function as an anode of the electroluminescent display device. If the electroluminescent display device according to the present invention is the bottom emission type, the first electrode 300 serves as a transparent electrode. Meanwhile, if the electroluminescent display device according to the present invention is the top emission type, the first electrode 300 serves as a reflective electrode.

The bank layer 400 covers an end of the first electrode 300, and the bank layer 400 is provided on the circuit device layer 200.

The bank layer 400 is provided along the boundary between the first pixel (P1) and the second pixel (P2). According as the bank layer 400 is provided along the boundary between the pixels (P1, P2), it is possible to define the area of the emission layer 510 and 520.

The bank layer 400 may include a first bank layer 410 and a second bank layer 420.

The first bank layer 410 is additionally provided along the boundary between each of the plurality of sub pixels (sP1, sP2, sP3, sP4) provided in each of the first pixel (P1) and the second pixel (P2). The first bank layer 410 is formed in a matrix configuration, to thereby define an area for each of the plurality of sub pixels (sP1, sP2, sP3, sP4).

The first bank layer 410 is in contact with the first electrode 300 and the circuit device layer 200. A thickness of the first bank layer 410 is smaller than a thickness of the second bank layer 420, and a width of the first bank layer 410 is larger than a width of the second bank layer 420. Accordingly, an end of the first bank layer 410 is in contact with the emission layers 510 and 520. The first bank layer 410 with this structure has the same properties as those of the emission layers 510, that is, the hydrophilic properties. The first bank layer 410 having the hydrophilic properties may be formed of an inorganic insulating material such as silicon oxide. Accordingly, when coating the solution for the emission layer 510 and 520, the solution easily spreads on the first bank layer 410 so that the emission layer 510 and 520 spreads widely in each sub pixel (sP1, sP2, sP3, sP4).

The second bank layer 420 is patterned on the first bank layer 410. The second bank layer 420 is provided along the boundary between the first pixel (P1) and the second pixel (P2). However, the second bank layer 420 may not be provided along the boundary between each of the plurality of sub pixels (sP1, sP2, sP3, sP4). That is, an upper surface of the first bank layer 410 provided below the second bank layer 420 is in contact with the second bank layer 420. However, the other portions of the upper surface of the first bank layer 410, which are not provided below the second bank layer 420, are in contact with the first emission layer 510 or the second emission layer 520, to thereby improve spreadability of the solution for the emission layers 510 and 520.

A width of the second bank layer 420 is smaller than a width of the first bank layer 410. The second bank layer 420 may be patterned for a sequential process of coating a mixture solution obtained by mixing the organic insulating material having the hydrophilic properties with a hydrophobic material such as fluorine, and carrying out a photolithography process. By light irradiated for the photolithography process, the hydrophobic material such as fluorine is transferred to an upper portion 420a of the second bank layer 420, whereby the upper portion 420a of the second bank layer 420 has the hydrophobic properties, and the other portions of the second bank layer 420 except the upper portion 420a have the hydrophilic properties, but are not limited to these structures. That is, the other portions of the second bank layer 420 being in contact with the first bank layer 410 have the hydrophilic properties, and the upper portion 420a of the second bank layer 420 has the hydrophobic properties. However, it is not limited to this structure. For example, the entire portions of the second bank layer 420 may have the hydrophobic properties.

The spreadability of the solution for the emission layers 510 and 520 may be improved by the first bank layer 410 and the predetermined portions of the second bank layer 420 which have the hydrophilic properties. Especially, according as the first bank layer 410 whose thickness is smaller than that of the second bank layer 420 is provided widely, it is possible to prepare a two-step structure having the hydrophilic properties by a combination of the first bank layer 410 and the second bank layer 420. Thus, the solution for the emission layers 510 and 520 easily spreads to an end area of each pixel (P1, P2) so that it is possible to prevent the emission layers 510 and 520 from being upwardly rolled at the end area of each pixel (P1, P2) with the large thickness.

Also, the upper portion 420a of the second bank layer 420, which has the hydrophobic properties, prevents the solution for the emission layers 510 and 520 from spreading to the adjacent pixels (P1, P2) so that it is possible to prevent the first emission layer 510 from permeating into the second pixel (P2) and being mixed with the second emission layer 520, and also to prevent the second emission layer 520 from permeating into the first pixel (P1) and being mixed with the first emission layer 510.

The emission layers 510 and 520 are provided on the first electrode 300. The emission layers 510 and 520 include the first emission layer 510 provided in the first pixel (P1), and the second emission layer 520 provided in the second pixel (P2).

Each of the first emission layer 510 and the second emission layer 520 may be formed by a solution process using the inkjet apparatus. The first emission layer 510 and the second emission layer 520 may emit white light. According to the present invention, each emission layer 510 and 520 is provided to correspond to the plurality of sub pixels (sP1, sP2, sP3, sP4). If each emission layer 510 and 520 has a predetermined color, it is difficult to display an image. Thus, each emission layer 510 and 520 emits white light, and some of the sub pixels (sP1, sP2, sP3, sP4) may have color filters therein.

Each of the first emission layer 510 and the second emission layer 520, which emits white light, may be formed in a structure including a plurality of stacks emitting different-colored light. For example, the first emission layer 510 and the second emission layer 520 may be formed by a combination of a stack of emitting blue light and a stack of emitting yellow light, or by a combination of a stack of emitting blue light, a stack of emitting green light and a stack of emitting red light. At least one stack among the plurality of stacks may include at least one organic layer among a hole injecting layer, a hole transporting layer, an emitting layer, an electron transporting layer, and an electron injecting layer. In this case, each of the first emission layer 510 and the second emission layer 520 may include at least one organic layer among the plurality of organic layers. For example, each of the first emission layer 510 and the second emission layer 520 may be formed by a combination of a hole injecting layer, a hole transporting layer and an emitting layer, which are laminated by the solution process, and may be formed by a combination of an electron transporting layer and an electron injecting layer which are laminated by a deposition process such as evaporation. In this case, the organic layer formed by the deposition process may not be patterned by each of the first pixel (P1) and the second pixel (P2), but be provided on the entire surface of the substrate 100. If needed, the first emission layer 510 and the second emission layer 520 may be formed of an inorganic material such as quantum dot.

The second electrode 600 is provided on the emission layers 510 and 520 and the bank layer 400. The second electrode 600 may function as a cathode of the electroluminescent display device. If the electroluminescent display device according to the present invention is a top emission type, the second electrode 600 serves as a transparent electrode. Meanwhile, if the electroluminescent display device according to the present invention is a bottom emission type, the second electrode 600 serves as a reflective electrode.

Figure 4:
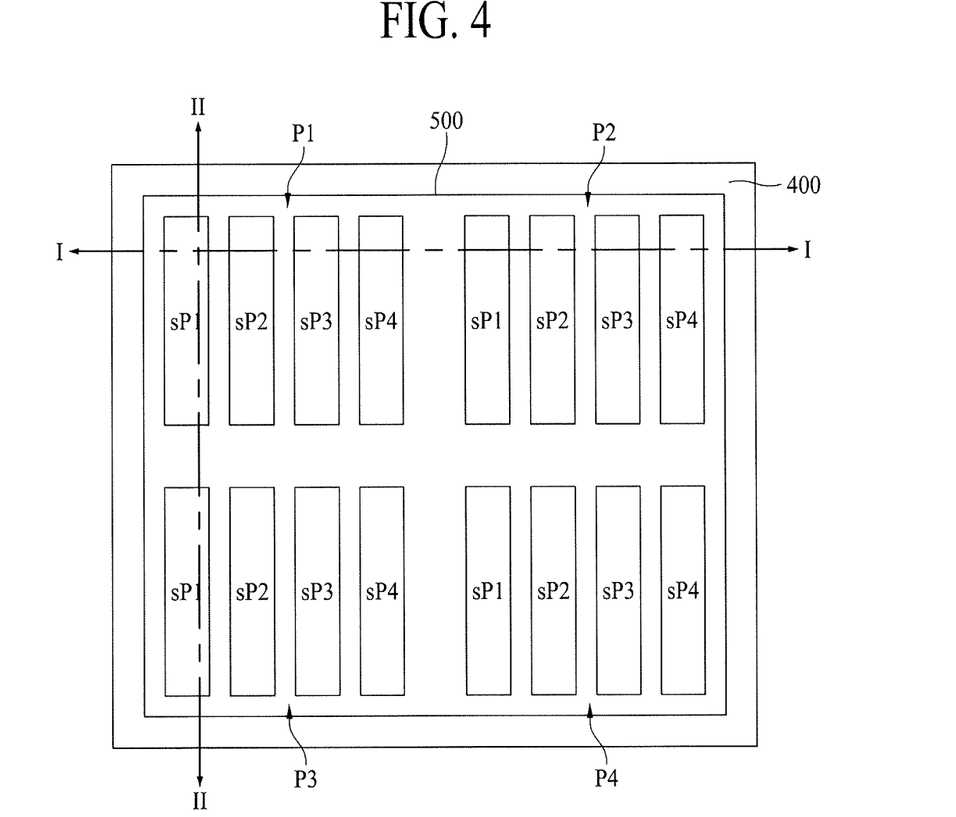
FIG. 4 a plane view illustrating an electroluminescent display device according to another embodiment of the present invention.

FIG. 4 is a plane view illustrating an electroluminescent display device according to another embodiment of the present invention.

As shown in FIG. 4, the electroluminescent display device according to another embodiment of the present invention may include a plurality of pixels (P1, P2, P3, P4) arranged in a first direction, for example, a horizontal direction, and arranged in a second direction, for example, a vertical direction.

Each of the plurality of pixels (P1, P2, P3, P4) may include a first sub pixel (sP1), a second sub pixel (sP2), a third sub pixel (sP3) and a fourth sub pixel (sP4). In the same manner as the aforementioned embodiment of FIG. 2, the first sub pixel (sP1), the second sub pixel (sP2), the third sub pixel (sP3) and the fourth sub pixel (sP4) are arranged in the first direction, but are not limited to this structure. An arrangement of the sub pixels and the number of the sub pixels may be changed in various ways.

Unlike the aforementioned embodiment of FIG. 2, one emission layer 500 is provided to correspond to the first pixel (P1), the second pixel (P2), the third pixel (P3) and the fourth pixel (P4).

The emission layer 500 is provided for the sub pixels (sP1, sP2, sP3, sP4) of the respective pixels (P1, P2, P3, P4) in common. Accordingly, the emission layer 500 is provided inside the respective first, second, third and fourth pixels (P1, P2, P3, P4), and also provided along the boundary between each of the respective pixels (P1, P2, P3, P4). The emission layers 500 provided inside the respective first, second, third and fourth pixels (P1, P2, P3, P4) are connected with each other, and furthermore, formed as one body.

A bank layer 400 is provided in the periphery of the emission layer 500. The bank layer 400 surrounds the emission layer 500, to thereby define an area of the emission layer 500.

According to another embodiment of the present invention, the emission layer 500 is provided to correspond to the plurality of pixels (P1, P2, P3, P4). Thus, even though each of the plurality of pixels (P1, P2, P3, P4) is decreased in size, a size in the area of the emission layer 500 is not largely decreased so that it is possible to form the emission layer 500 by the use of inkjet apparatus with easiness, to thereby realize a high-resolution electroluminescent display device.

In FIG. 4, one emission layer 500 is provided to correspond to the four pixels (P1, P2, P3, P4) arranged in the first direction and the second direction, but is not limited to this structure. The emission layer 500 may be provided to correspond to at least two of the pixels (P1, P2, P3, P4). Also, one emission layer 500 may be provided to correspond to at least two pixels (P1 and P2, or P3 and P4) arranged in the first direction, or may be provided to correspond to at least two pixels (P1 and P3, or P2 and P4) arranged in the second direction.

Figure 5:
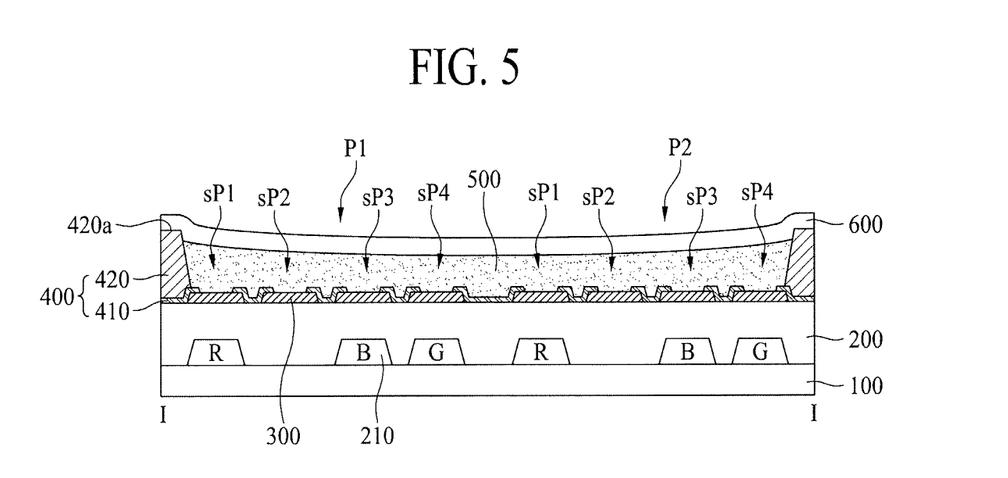
FIG. 5 is a cross sectional view illustrating the electroluminescent display device according to another embodiment of the present invention, which corresponds to a cross section along I-I line of FIG. 4.

FIG. 5 is a cross sectional view illustrating the electroluminescent display device according to another embodiment of the present invention, which corresponds to a cross section along I-I line of FIG. 4.

As shown in FIG. 5, the electroluminescent display device according to another embodiment of the present invention may include a substrate 100, a circuit device layer 200, a first electrode 300, a bank layer 400, an emitting layer 500, and a second electrode 600.

The substrate 100, the circuit device layer 200, the first electrode 300 and the second electrode 600 are the same as those of the aforementioned embodiment, whereby a detailed description for the substrate 100, the circuit device layer 200, the first electrode 300 and the second electrode 600 will be omitted.

The bank layer 400 covers an end of the first electrode 300, and the bank layer 400 is provided on the circuit device layer 200. The bank layer 400 may include a first bank layer 410 and a second bank layer 420. A material and shape of the first bank layer 410 and the second bank layer 420 is the same as that of the aforementioned embodiment, whereby a detailed description for the same parts will be omitted. Hereinafter, only arrangement structure of the first bank layer 410 and the second bank layer 420 will be described in detail as follows.

In the same manner as the aforementioned embodiment of FIG. 3, the first bank layer 410 is provided along the boundary between the first pixel (P1) and the second pixel (P2), and also provided along the boundary between each of the plurality of sub pixels (sP1, sP2, sP3, sP4) included in the respective pixels (P1, P2).

Unlike the aforementioned embodiment of FIG. 3, the second bank layer 420 is not provided along the boundary between the first pixel (P1) and the second pixel (P2), but provided at both ends of the emission layer 500.

Accordingly, the emission layers 500 of the respective pixels (P1, P2) are connected with each other inside the second bank layer 420, and are formed as one body. A material for the emission layer 500 is the same as that of the aforementioned embodiment.

Figure 6:
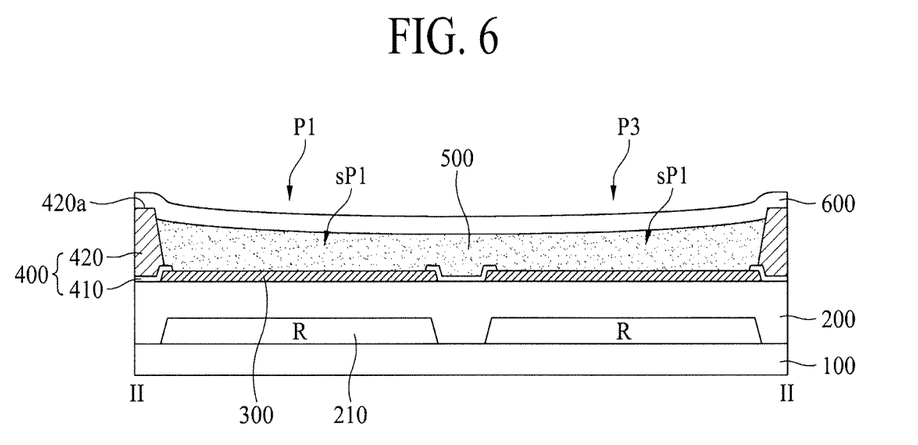
FIG. 6 is a cross sectional view illustrating the electroluminescent display device according to another embodiment of the present invention, which corresponds to a cross section along II-II line of FIG. 4.

FIG. 6 is a cross sectional view illustrating the electroluminescent display device according to another embodiment of the present invention, which corresponds to a cross section along II-II line of FIG. 4.

FIG. 6 shows that the emission layers 500 are connected with each other in the first pixel (P1) and the third pixel (P3), and are formed as one body, and other portions are nearly the same as those of FIG. 5, whereby a detailed description for the same parts will be omitted.

Figure 7:
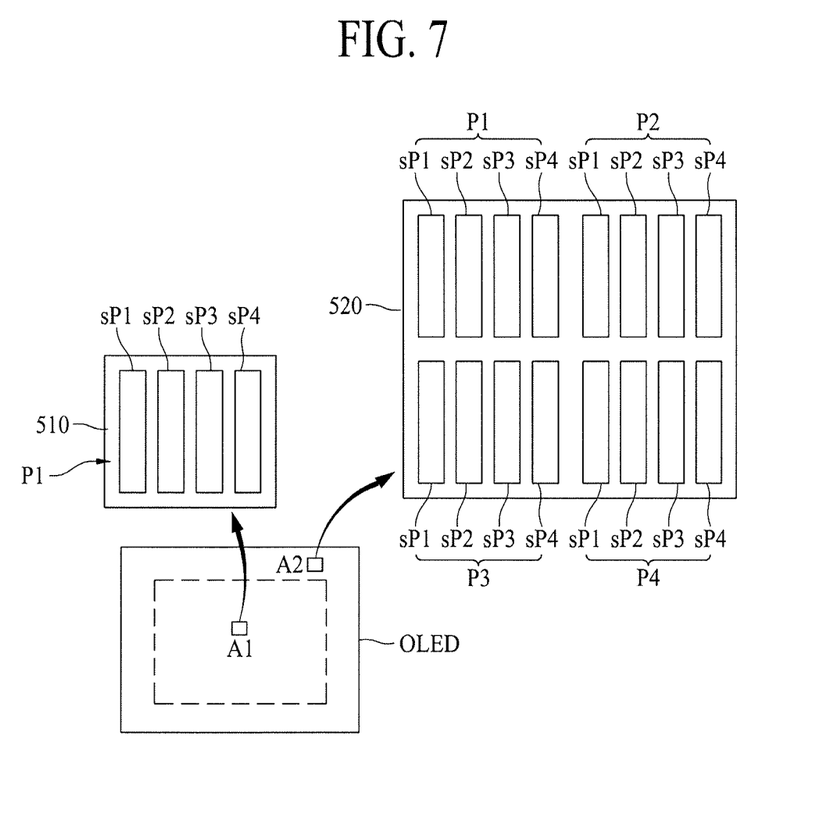
FIG. 7 is a plane view illustrating an electroluminescent display device according to another embodiment of the present invention.

FIG. 7 is a plane view illustrating an electroluminescent display device according to another embodiment of the present invention.

As shown in FIG. 7, the electroluminescent display device according to another embodiment of the present invention may include a first area (A1) and a second area (A2).

The second area (A2) corresponds to a peripheral area of the first area (A1). A dotted line is an imaginary line for the division between the first area (A1) and the second area (A2). A first emission layer 510 is provided in the first area (A1), and a second emission layer 520 is provided in the second area (A2).

For a process of forming the emission layers 510 and 520, a solution dry speed for the emission layers 510 and 520 in the first area (A1) corresponding to the central of a substrate may be different from a solution dry speed for the emission layers 510 and 520 in the second area (A2) corresponding to the periphery of the substrate.

In more detail, the solution dry speed for the emission layers 510 and 520 in the second area (A2) corresponding to the periphery of the substrate may be rapider than the solution dry speed for the emission layers 510 and 520 in the first area (A1) corresponding to the central of the substrate. In this case, a profile of the first emission layer 510 provided in the first area (A1) is different from a profile of the second emission layer 520 provided in the second area (A2) so that it is difficult to realize uniformity of image.

According to another embodiment of the present invention, the number of sub pixels (sP1, sP2, sP3, sP4) for the first emission layer 510 of the first area (A1) is different from the number of sub pixels (sP1, sP2, sP3, sP4) for the second emission layer 520 of the second area (A2). That is, a size of an area in the first emission layer 510 of the first area (A1) is different from a size of an area in the second emission layer 520 of the second area (A2).

In detail, the number of sub pixels (sP1, sP2, sP3, sP4) in the second emission layer 520 of the second area (A2) is larger than the number of sub pixels (sP1, sP2, sP3, sP4) in the first emission layer 510 of the first area (A1). For example, as shown in the drawings, the number of sub pixels (sP1, sP2, sP3, sP4) in the second emission layer 520 of the second area (A2) is '16, and the number of sub pixels (sP1, sP2, sP3, sP4) in the first emission layer 510 of the first area (A1) is '4', but not necessarily. The number of sub pixels (sP1, sP2, sP3, sP4) in the second emission layer 520 of the second area (A2) can be 2 or more than 2, and the number of sub pixels (sP1, sP2, sP3, sP4) in the first emission layer 510 of the first area (A1) can be 1 or more than 1.

In other words, the size of the area of the second emission layer 520 in the second area (A2) is larger than the size of the area of the first emission layer 510 in the first area (A1). That is, the size of the area of the second emission layer 520 in the second area (A2), wherein the solution dry speed is relatively rapid, is larger than the size of the area of the first emission layer 510 in the first area (A1) wherein the solution dry speed is relatively slow. Thus, even though the solution dry speed in the second emission layer 520 is rapider than the solution dry speed in the first emission layer 510, the amount of solution for the second emission layer 520 is relatively larger than the amount of solution for the first emission layer 510, whereby there is no large difference between a solution dry completion point for the second emission layer 520 and a solution dry completion point for the first emission layer 510. Thus, it is possible to decrease the difference between the profile of the first emission layer 510 and the profile of the second emission layer 520, thereby reducing a problem related with uniformity of image.

According to another embodiment of the present invention, there are the first area (A1) and the second area (A2), wherein the number of sub pixels (sP1, sP2, sP3, sP4) for the first area (A1) is different from the number of sub pixels (sP1, sP2, sP3, sP4) for the second area (A2). Thus, it is possible to appropriately adjust the solution dry completion point for each of the first emission layer 510 and the second emission layer 520 with easiness, to thereby improve picture quality.

Meanwhile, the second area (A2) having the second emission layer 520 with the relatively-large number of sub pixels (sP1, sP2, sP3, sP4) may be disposed in at least one side of the substrate, and the first area (A1) having the first emission layer 510 with the relatively-small number of sub pixels (sP1, sP2, sP3, sP4) may be disposed in the remaining portions of the substrate.

Figure 8:
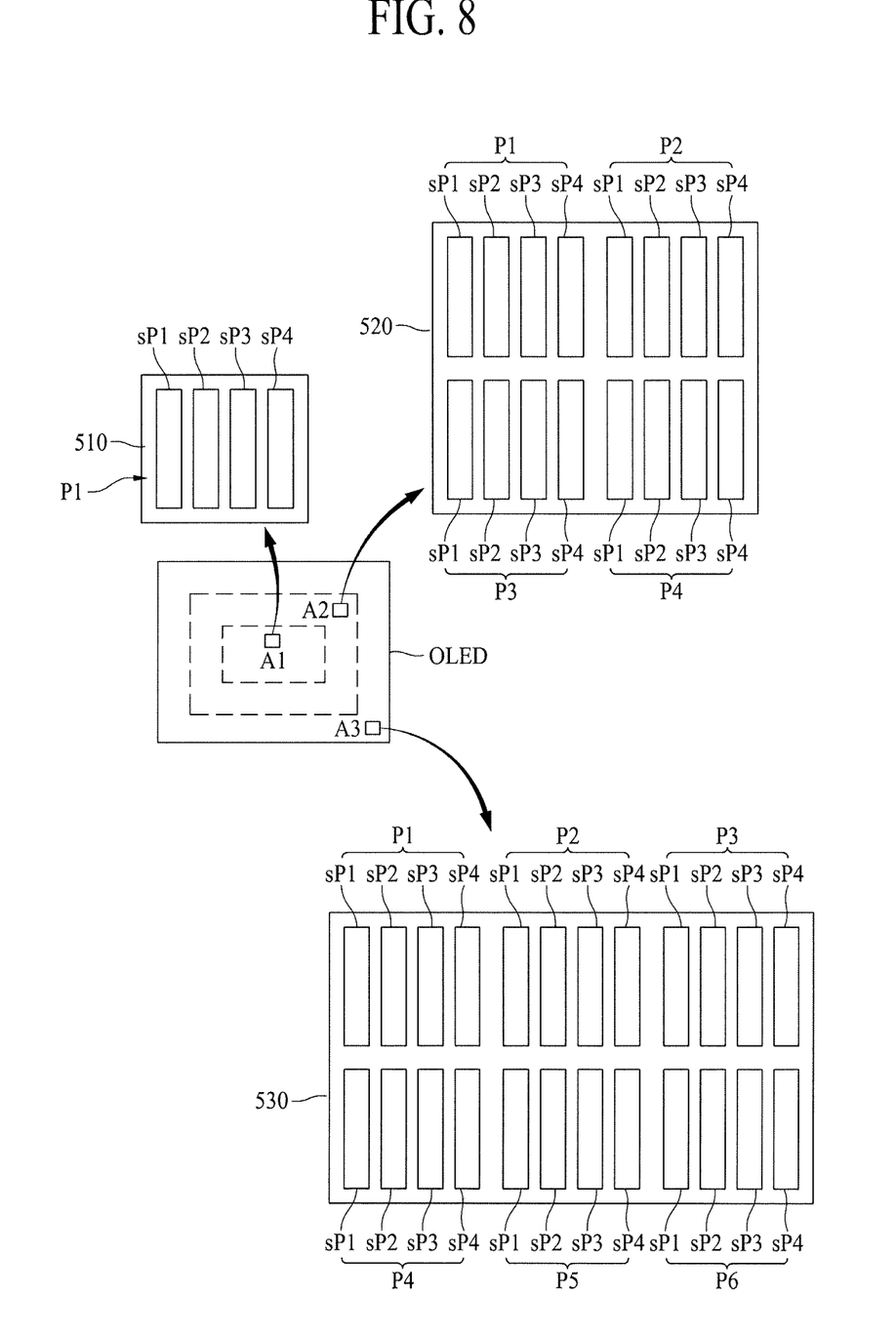
FIG. 8 is a plane view illustrating an electroluminescent display device according to another embodiment of the present invention.

FIG. 8 is a plane view illustrating an electroluminescent display device according to another embodiment of the present invention.

As shown in FIG. 8, the electroluminescent display device (OLED) may include a first area (A1), a second area (A2) and a third area (A3).

The second area (A2) corresponds to a peripheral area of the first area (A1), and the third area (A3) corresponds to a peripheral area of the second area (A2). A dotted line is an imaginary line for the division among the first area (A1), the second area (A2) and the third area (A3).

A solution dry speed in the third area (A3) may be rapider than a solution dry speed in the second area (A2), and the solution dry speed in the second area (A2) may be rapider than a solution dry speed in the first area (A1).

Accordingly, a size of an area for the third emission layer 530 of the third area (A3) is larger than a size of an area for the second emission layer 520 of the second area (A2), and the size of the area for the second emission layer 520 of the second area (A2) is larger than a size of an area for the first emission layer 510 of the first area (A1).

That is, the number of sub pixels (sP1, sP2, sP3, sP4) in the third emission layer 530 of the third area (A3) is larger than the number of sub pixels (sP1, sP2, sP3, sP4) in the second emission layer 520 of the second area (A2), and the number of sub pixels (sP1, sP2, sP3, sP4) in the second emission layer 520 of the second area (A2) is larger than the number of sub pixels (sP1, sP2, sP3, sP4) in the first emission layer 510 of the first area (A1).

For example, the number of sub pixels (sP1, sP2, sP3, sP4) in the third emission layer 530 of the third area (A3) can be 4 or more than 4, the number of sub pixels (sP1, sP2, sP3, sP4) in the second emission layer 520 of the second area (A2) can be 3 or more than 3, and the number of sub pixels (sP1, sP2, sP3, sP4) in the first emission layer 510 of the first area (A1) can be 2 or more than 2. However, the number of sub pixels (sP1, sP2, sP3, sP4) in the first emission layer 510 of the first area (A1) may be 1. In this case, the number of sub pixels (sP1, sP2, sP3, sP4) in the second emission layer 520 of the second area (A2) may be 2 or more than 2, and the number of sub pixels (sP1, sP2, sP3, sP4) in the third emission layer 530 of the third area (A3) may be 3 or more than 3.

According to another embodiment of the present invention, there are the first area (A1), the second area (A2) and the third area (A3), wherein the number of sub pixels in the first area (A1), the number of sub pixels in the second area (A2) and the number of sub pixels in the third area (A3) are different from one another. Thus, it is possible to appropriately adjust the solution dry completion point for each of the first emission layer 510, the second emission layer 520 and the third emission layer 530 with easiness, to thereby improve picture quality.

Figure 9:
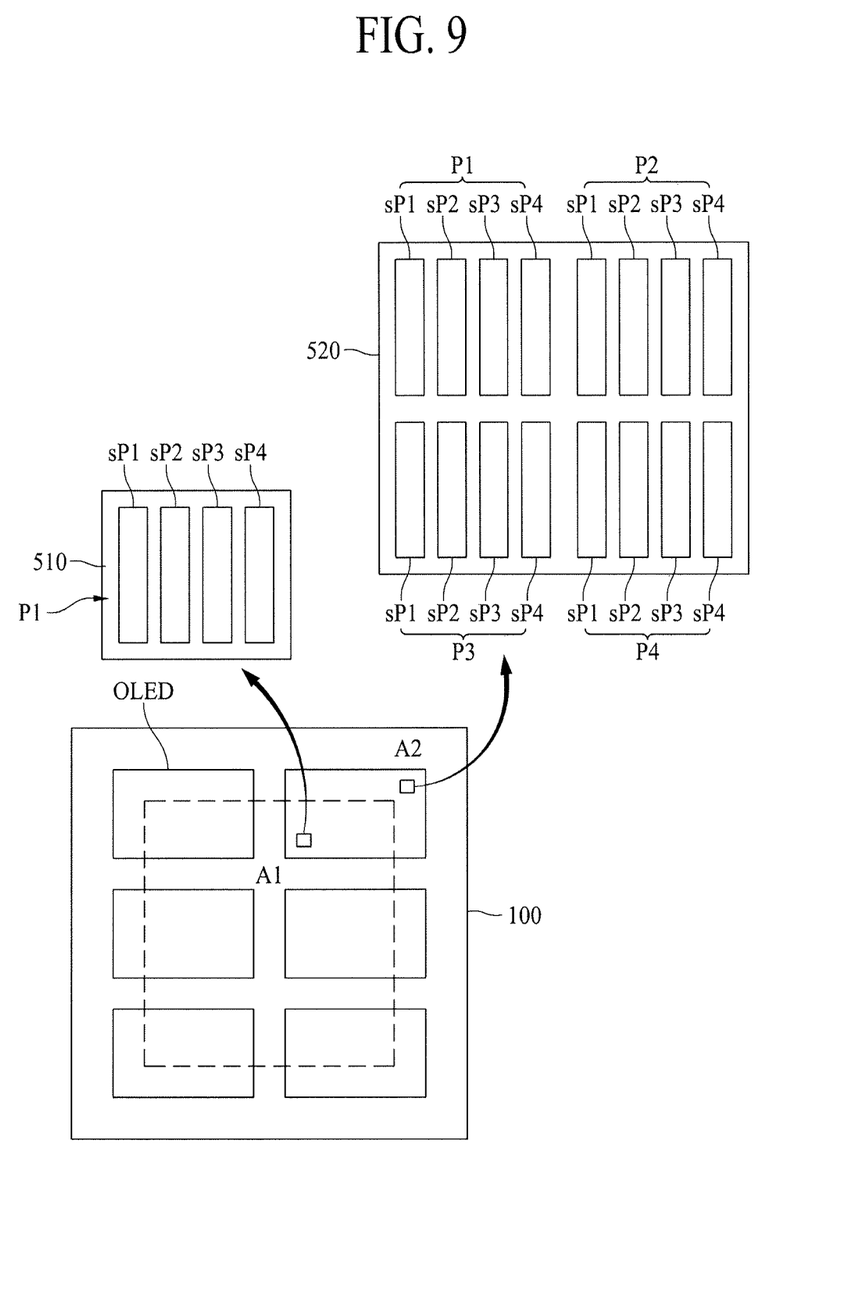
FIG. 9 is a plane view illustrating an electroluminescent display device according to another embodiment of the present invention.

FIG. 9 is a plane view illustrating an electroluminescent display device according to another embodiment of the present invention. FIG. 9 shows that a plurality of electroluminescent display devices (OLED) are provided on a substrate 100, which corresponds to the substrate 100 before a scribing process.

As shown in FIG. 9, the plurality of electroluminescent display devices (OLED) are provided on the substrate 100. The plurality of electroluminescent display devices (OLED) are separated by the scribing process after a process of forming the aforementioned various elements such as emission layers 510 and 520.

For the process of forming the emission layers 510 and 520, a solution dry speed for the emission layers 510 and 520 in a first area (A1) corresponding to the center of the substrate 100 may be different from a solution dry speed for the emission layers 510 and 520 in a second area (A2) corresponding to the periphery of the substrate 100. A dotted line is an imaginary line for the division between the first area (A1) and the second area (A2).

In more detail, the solution dry speed for the emission layers 510 and 520 in the second area (A2) corresponding to the periphery of the substrate 100 may be rapider than the solution dry speed for the emission layers 510 and 520 in the first area (A1) corresponding to the central of the substrate 100. In this case, a profile of the first emission layer 510 provided in the first area (A1) is different from a profile of the second emission layer 520 provided in the second area (A2) so that it is difficult to realize uniformity of image.

According to another embodiment of the present invention, the number of sub pixels (sP1, sP2, sP3, sP4) in the first emission layer 510 of the first area (A1) is different from the number of sub pixels (sP1, sP2, sP3, sP4) in the second emission layer 520 of the second area (A2). That is, a size of an area of the first emission layer 510 in the first area (A1) is different from a size of an area of the second emission layer 520 in the second area (A2).

In detail, the number of sub pixels (sP1, sP2, sP3, sP4) in the second emission layer 520 of the second area (A2) is larger than the number of sub pixels (sP1, sP2, sP3, sP4) in the first emission layer 510 of the first area (A1).

In other words, the size of the area of the second emission layer 520 in the second area (A2) is larger than the size of the area of the first emission layer 510 in the first area (A1).

That is, the size of the area in the second emission layer 520 of the second area (A2), wherein the solution dry speed is relatively rapid, is larger than the size of the area in the first emission layer 510 of the first area (A1) wherein the solution dry speed is relatively slow. Thus, even though the solution dry speed in the second emission layer 520 is rapider than the solution dry speed in the first emission layer 510, the amount of solution for the second emission layer 520 is relatively larger than the amount of solution for the first emission layer 510, whereby there is no large difference between a solution dry completion point for the second emission layer 520 and a solution dry completion point for the first emission layer 510. Thus, it is possible to decrease the difference between the profile of the first emission layer 510 and the profile of the second emission layer 520, thereby reducing a problem related with uniformity of image.

In this reason, for example, the first emission layer 510 of the first area (A1) is provided to correspond to the first pixel (P1) including the plurality of sub pixels (sP1, sP2, sP3, sP4), and the second emission layer 520 of the second area (A2) is provided to correspond to the first pixel (P1) including the plurality of sub pixels (sP1, sP2, sP3, sP4), the second pixel (P2) including the plurality of sub pixels (sP1, sP2, sP3, sP4), the third pixel (P3) including the plurality of sub pixels (sP1, sP2, sP3, sP4), and the fourth pixel (P4) including the plurality of sub pixels (sP1, sP2, sP3, sP4).

The number of sub pixels (sP1, sP2, sP3, sP4) in the second emission layer 520 is larger than the number of sub pixels (sP1, sP2, sP3, sP4) in the first emission layer 510. Also, the number of sub pixels (sP1, sP2, sP3, sP4) in the second emission layer 520 and the number of sub pixels (sP1, sP2, sP3, sP4) in the first emission layer 510 may be changed in various ways. For example, the number of sub pixels (sP1, sP2, sP3, sP4) in the second emission layer 520 can be 3 or more than 3, and the number of sub pixels (sP1, sP2, sP3, sP4) in the first emission layer 510 can be 2 or more than 2. If needed, the number of sub pixels (sP1, sP2, sP3, sP4) in the second emission layer 520 may be 2 or more than 2, and the number of sub pixels (sP1, sP2, sP3, sP4) in the first emission layer 510 may be 1.

An arrangement structure of the first area (A1) and the second area (A2) may not be the same in the plurality of electroluminescent display devices (OLED) separated by the scribing process. For example, in case of the electroluminescent display device (OLED) provided at four corners of the substrate 100 before the scribing process, two sides connected with each other among four sides, for example, upper and lateral sides or lower and lateral sides may form the second area (A2). In case of the electroluminescent display device (OLED) provided at other portions except the four corners of the substrate 100, any one side, for example, a lateral side may form the second area (A2). However, it is not limited to this structure. In the plurality of electroluminescent display devices (OLED), the first area (A1) and the second area (A2) may be changed in various ways.

Figure 10:
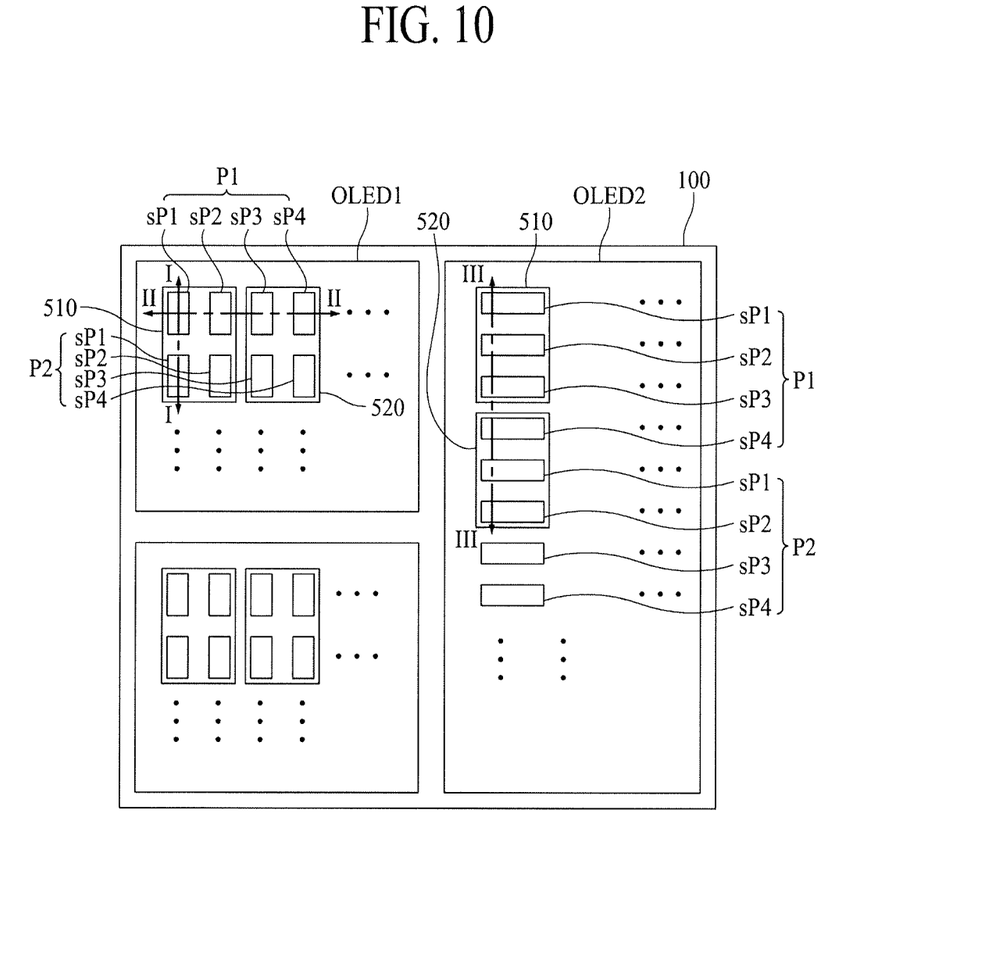
FIG. 10 is a plane view illustrating an electroluminescent display device according to another embodiment of the present invention.

FIG. 10 is a plane view illustrating an electroluminescent display device according to another embodiment of the present invention. FIG. 10 shows that a plurality of electroluminescent display devices (OLED1, OLED2) are provided on a substrate 100, which corresponds to the substrate 100 before a scribing process.

As shown in FIG. 10, the plurality of electroluminescent display devices (OLED1, OLED2) having the different sizes may be provided on the substrate 100.

Each of the electroluminescent display devices (OLED1, OLED2) is provided with a plurality of pixels (P1, P2), and each of the pixels (P1, P2) is provided with a plurality of sub pixels (sP1, sP2, sP3, sP4). An arrangement and number of the plurality of pixels (P1, P2) and the plurality of sub pixels (sP1, sP2, sP3, sP4) may be changed in various ways.

Also, emission layers 510 and 520 are provided in each of the electroluminescent display devices (OLED1, OLED2). In this case, a size of the emission layer 510 and 520 may be identical in the respective electroluminescent display devices (OLED1, OLED2). That is, if the emission layers 510 and 520 are coated in the same coating method by the use of the same inkjet apparatus, the same sized emission layers 510 and 520 may be formed on the respective electroluminescent display devices (OLED1, OLED2).

The first electroluminescent display device (OLED1) may include the pixels (P1, P2) provided with the plurality of sub pixels (sP1, sP2, sP3, sP4) arranged in the horizontal direction, and the plurality of pixels (P1, P2) are arranged in the horizontal and vertical directions. In this case, for example, the emission layers 510 and 520 are provided for the two sub pixels (sP1, sP2, sP3, sP4) arranged in the horizontal direction, and the two sub pixels (sP1, sP2, sP3, sP4) arranged in the vertical direction.

In this case, the first emission layer 510 may be provided to correspond to the first and second sub pixels (sP1, sP2) of the first pixel (P1), and the first and second sub pixels (sP1, sP2) of the second pixel (P2), and the second emission layer 520 may be provided to correspond to the third and fourth sub pixels (sP3, sP4) of the first pixel (P1), and the third and fourth sub pixels (sP3, sP4) of the second pixel (P2).

That is, one emission layer 510 and 520 may be provided to correspond to the sub pixels (sP1, sP2, sP3, sP4) in the different pixels (P1, P2). However, one emission layer 510 and 520 may be provided to correspond to some sub pixels (sP1, sP2, sP3, sP4) among the sub pixels (sP1, sP2, sP3, sP4) in the respective pixels (P1, P2). Accordingly, it is possible to appropriately adjust the area of the emission layer 510 and 520 in accordance with a nozzle of the inkjet apparatus. In this case, the number of pixels (P1, P2) and the number of sub pixels (sP1, sP2, sP3, sP4) in the emission layers 510 and 520 may be changed in various ways in consideration of the nozzle of the inkjet apparatus.

The second electroluminescent display device (OLED2) may include the pixels (P1, P2) provided with the plurality of sub pixels (sP1, sP2, sP3, sP4) arranged in the vertical direction, and the plurality of pixels (P1, P2) are arranged in the horizontal and vertical directions. In this case, for example, the emission layers 510 and 520 may be provided to correspond to the three sub pixels (sP1, sP2, sP3, sP4) arranged in the vertical direction. A size and arrangement of the sub pixels (sP1, sP2, sP3, sP4) of the second electroluminescent display device (OLED2) is different from a size and arrangement of the sub pixels (sP1, sP2, sP3, sP4) of the first electroluminescent display device (OLED1). In order to provide the same size of the emission layer 510 and 520 in the first electroluminescent display device (OLED1) and the second electroluminescent display device (OLED2), the number of sub pixels (sP1, sP2, sP3, sP4) for the emission layer 510 and 520 of the second electroluminescent display device (OLED2) may be different from the number of sub pixels (sP1, sP2, sP3, sP4) for the emission layer 510 and 520 of the first electroluminescent display device (OLED1). For example, the number of sub pixels (sP1, sP2, sP3, sP4) for the emission layer 510 and 520 of the second electroluminescent display device (OLED2) may be 3, and the number of sub pixels (sP1, sP2, sP3, sP4) for the emission layer 510 and 520 of the first electroluminescent display device (OLED1) may be 4.

Accordingly, the first emission layer 510 of the second electroluminescent display device (OLED2) is provided to correspond to the first, second and third sub pixels (sP1, sP2, sP3) of the first pixel (P1), and the second emission layer 520 of the second electroluminescent display device (OLED2) is provided to correspond to the fourth sub pixel (sP4) of the first pixel (P1), and the first and second sub pixels (sP1, sP2) of the second pixel (P2).

That is, one emission layer 510 and 520 is provided to correspond to the sub pixels (sP1, sP2, sP3, sP4) of the different pixels (P1, P2). However, one emission layer 510 and 520 may be provided to correspond to some sub pixels (sP1, sP2, sP3, sP4) among the sub pixels (sP1, sP2, sP3, sP4) of each pixel (P1, P2). Also, the number of sub pixels (sP1, sP2, sP3, sP4) in one emission layer 510 and 520 may be changed by each pixel (P1, P2).

Figure 11:
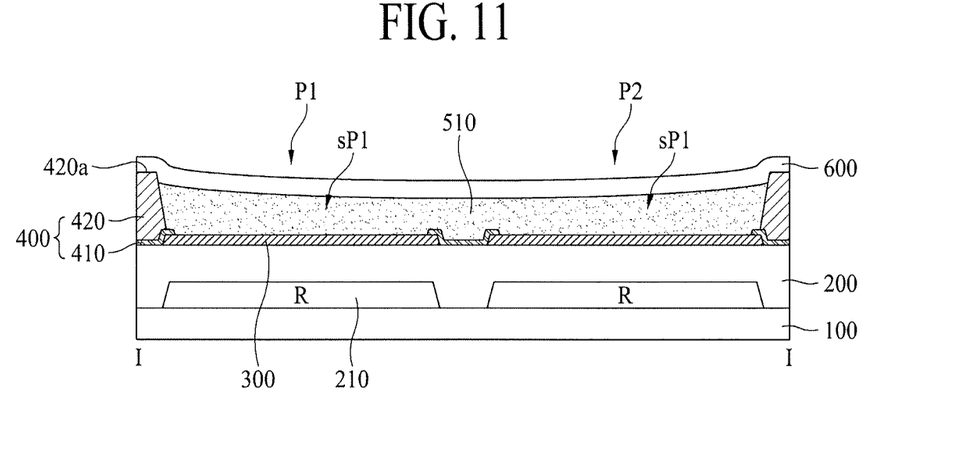
FIG. 11 is a cross sectional view illustrating the electroluminescent display device according to another embodiment of the present invention, which corresponds to a cross section along I-I line of FIG. 10.

FIG. 11 is a cross sectional view illustrating the electroluminescent display device according to another embodiment of the present invention, which corresponds to a cross section along I-I line of FIG. 10.

As shown in FIG. 11, the electroluminescent display device according to another embodiment of the present invention may include a substrate 100, a circuit device layer 200, a first electrode 300, a bank layer 400, a first emission layer 510, and a second electrode 600.

The substrate 100, the circuit device layer 200, the first electrode 300, and the second electrode 600 are the same as those of the aforementioned embodiment, whereby a detailed description for the substrate 100, the circuit device layer 200, the first electrode 300, and the second electrode 600 will be omitted.

The bank layer 400 may include a first bank layer 410 and a second bank layer 420. A material and shape of the first bank layer 410 and the second bank layer 420 is the same as that of the aforementioned embodiment, whereby a detailed description for the same parts will be omitted. Hereinafter, only arrangement structure of the first bank layer 410 and the second bank layer 420 will be described in detail as follows.

The first bank layer 410 is provided along the boundary between the first sub pixel (sP1) of the first pixel (P1) and the first sub pixel (sP1) of the second pixel (P2). However, the second bank layer 420 is not provided along the boundary between the first sub pixel (sP1) of the first pixel (P1) and the first sub pixel (sP1) of the second pixel (P2), but provided at both ends of the first emission layer 510. Accordingly, the first emission layers 510 of the respective pixels (P1, P2) are connected with each other inside the second bank layer 420, and are formed as one body.

Figure 12:
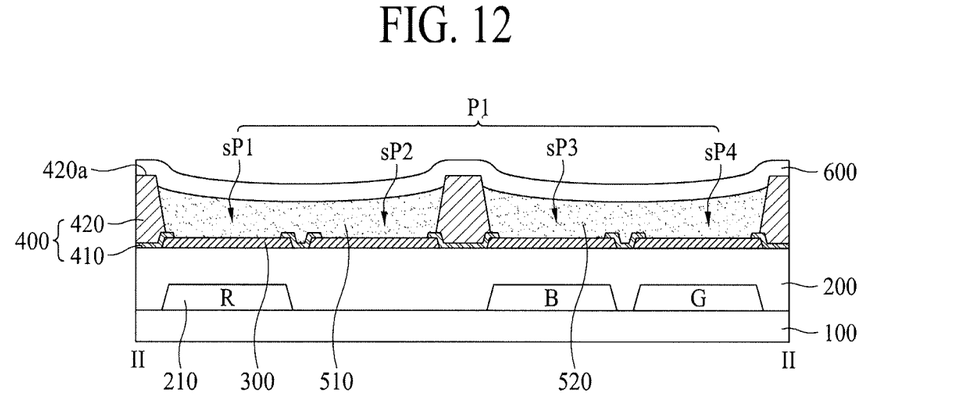
FIG. 12 is a cross sectional view illustrating the electroluminescent display device according to another embodiment of the present invention, which corresponds to a cross section along II-II line of FIG. 10.

FIG. 12 is a cross sectional view illustrating the electroluminescent display device according to another embodiment of the present invention, which corresponds to a cross section along II-II line of FIG. 10.

As shown in FIG. 12, the electroluminescent display device according to another embodiment of the present invention may include a substrate 100, a circuit device layer 200, a first electrode 300, a bank layer 400, first and second emission layers 510 and 520, and a second electrode 600.

The substrate 100, the circuit device layer 200, the first electrode 300, and the second electrode 600 are the same as those of the aforementioned embodiment, whereby a detailed description for the substrate 100, the circuit device layer 200, the first electrode 300 and the second electrode 600 will be omitted.

The bank layer 400 may include a first bank layer 410 and a second bank layer 420.

The first bank layer 410 is provided along the boundary between each of the sub pixels (sP1, sP2, sP3, sP4) of the first pixel (P1). The second bank layer 420 is provided along the boundary between the first emission layer 510 and the second emission layer 520. That is, the second bank layer 420 is provided inside the first pixel (P1), and more particularly, along the boundary between the second sub pixel (sP2) and the third sub pixel (sP3) of the first pixel (P1).

Each of the first emission layer 510 and the second emission layer 520 is provided in the first pixel (P1), and the first emission layer 510 and the second emission layer 520 are separated from each other by the second bank layer 420 inside the first pixel (P1). In this case, the first emission layers 510 of the respective first and second sub pixels (sP1, sP2) of the first pixel (P1) are connected with each, and are formed as one body, and the second emission layers 520 of the respective third and fourth sub pixels (sP3, sP4) of the first pixel (P1) are connected with each, and are formed as one body.

Figure 13:
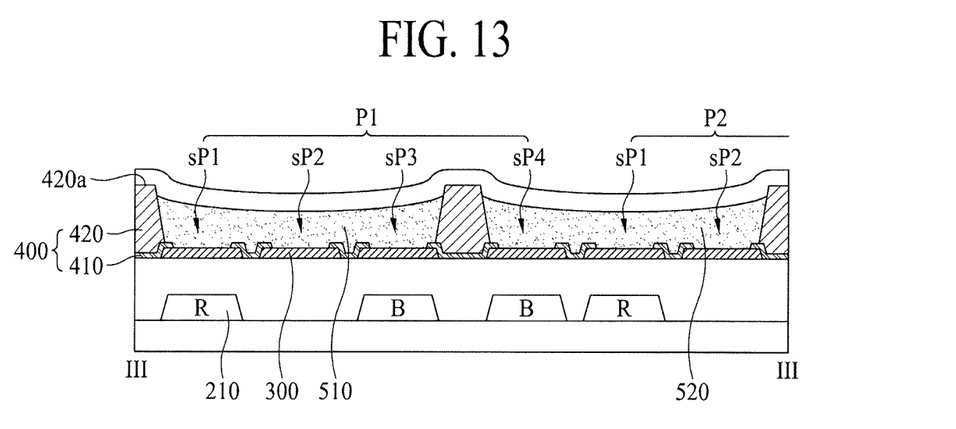
FIG. 13 is a cross sectional view illustrating the electroluminescent display device according to another embodiment of the present invention, which corresponds to a cross section along line of FIG. 10.

FIG. 13 is a cross sectional view illustrating the electroluminescent display device according to another embodiment of the present invention, which corresponds to a cross section along III-III line of FIG. 10.

As shown in FIG. 13, the electroluminescent display device according to another embodiment of the present invention may include a substrate 100, a circuit device layer 200, a first electrode 300, a bank layer 400, first and second emission layers 510 and 520, and a second electrode 600.

The substrate 100, the circuit device layer 200, the first electrode 300 and the second electrode 600 are the same as those of the aforementioned embodiment, whereby a detailed description for the substrate 100, the circuit device layer 200, the first electrode 300 and the second electrode 600 will be omitted.

The bank layer 400 may include a first bank layer 410 and a second bank layer 420.

The first bank layer 410 is provided along the boundary between each of the sub pixels (sP1, sP2, sP3, sP4) of the first pixel (P1) and the second pixel (P2). The second bank layer 420 is provided along the boundary between the first emission layer 510 and the second emission layer 520. That is, the second bank layer 420 is provided inside the first pixel (P1) and the second pixel (P2), and more particularly, along the boundary between the third sub pixel (sP3) and the fourth sub pixel (sP4) of the first pixel (P1) and the boundary between the second sub pixel (sP2) and the third sub pixel (sP3) of the second pixel (P2).

The first emission layer 510 is provided in the first pixel (P1). In detail, the first emission layers 510 provided in the respective first, second and third sub pixels (sP1, sP2, sP3) inside the first pixel (P1) are connected with each other, and furthermore, formed as one body.

The second emission layer 520 is provided in the first pixel (P1) and the second pixel (P2). In detail, the second emission layers 520 provided in the fourth sub pixel (sP4) of the first pixel (P1), and the first and second sub pixels (sP1, sP2) of the second pixel (P2) are connected with each other, and furthermore, formed as one body.

According to the embodiment(s) of the present invention, the emission layer is provided for the plurality of sub pixels. In this case, even though the plurality of sub pixels are decreased in size, the area of the emission layer is not decreased in size. As a result, it is possible to form the emission layers without being mixed together by the use of inkjet apparatus, to thereby realize the high-resolution electroluminescent display device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for manufacturing an electroluminescent display device, the method comprising:
    defining a plurality of pixels on a substrate;
    defining a plurality of sub pixels in each of the plurality of pixels;
    forming a first electrode at each of the sub pixels on the substrate;
    forming a bank layer covering an end of the first electrode on the substrate;
    coating a first emission layer corresponding to at least two sub pixels among the plurality of sub pixels; and
    coating a second emission layer corresponding to at least two other sub pixels among the plurality of sub pixels,
    wherein the second emission layer is spaced apart from the first emission layer.

2. The method according to claim 1, wherein each of the first emission layer and the second emission layer is coated to correspond to one pixel among the plurality of pixels.

3. The method according to claim 1, wherein each of the first emission layer and the second emission layer is coated to correspond to at least two pixels among the plurality of pixels.

4. The method according to claim 1, wherein at least one emission layer among the first emission layer and the second emission layer is coated to correspond to some sub pixels provided in one pixel among the plurality of pixels, and some sub pixels provided in another pixel among the plurality of pixels.

5. The method according to claim 1, wherein the number of sub pixels in the first emission layer is the same as the number of sub pixels in the second emission layer.

6. The method according to claim 1, wherein the number of sub pixels in the first emission layer is smaller than the number of sub pixels in the second emission layer.

7. The method according to claim 1, wherein a size of an area of the first emission layer and a size of an area of the second emission layer are different.

8. The method according to claim 1, wherein the second emission layer is disposed in a periphery of the first emission layer.

9. The method according to claim 1, further comprising:
    forming a circuit device layer under the first electrode on the substrate,
    wherein the circuit device layer includes a color filter corresponding to each of sub pixels, and
    wherein the first emission layer and the second emission layer emit white light.

10. The method according to claim 1, wherein the forming the bank layer includes:
    forming a first bank layer along a boundary of each of the first electrode on the substrate; and
    forming a second bank layer along a boundary between the pixels on the first bank.

* * * * *